United States Patent [19]

Price

[11] 4,150,366
[45] Apr. 17, 1979

[54] TRIM NETWORK FOR MONOLITHIC CIRCUITS AND USE IN TRIMMING A D/A CONVERTER

[75] Inventor: John J. Price, Mesa, Ariz.

[73] Assignee: Motorola, Inc., Schaumburg, Ill.

[21] Appl. No.: 719,549

[22] Filed: Sep. 1, 1976

[51] Int. Cl.² ............................................. H03K 13/02
[52] U.S. Cl. ............................. 340/347 CC; 338/195; 340/347 DA; 340/347 M
[58] Field of Search ................. 338/195; 340/347 DA, 340/347 CC

[56] References Cited

U.S. PATENT DOCUMENTS

| | | | |
|---|---|---|---|
| 3,191,151 | 6/1965 | Price | 340/166 R |
| 3,441,804 | 4/1969 | Klemmer | 361/402 |
| 3,761,787 | 9/1973 | Davis et al. | 357/40 |
| 3,890,610 | 6/1975 | Cahen | 340/347 DA |
| 3,930,304 | 1/1976 | Keller et al. | 29/574 |

OTHER PUBLICATIONS

Faber, Algorithmic Trimming on Active Circuit, Proceedings 1974, 24th Electronic Components Conference, IEEE/EIA, pp. 248-254.

Erdi, A Precision Trim Technique for Monolithic Analog Circuits, 1975 IEEE International Solid-State Circuits Conference, Digest of Technical Papers, pp. 192, 193.

Primary Examiner—Thomas J. Sloyan
Attorney, Agent, or Firm—Michael D. Bingham

[57] ABSTRACT

There is disclosed a trim network suitable to be utilized in monolithic circuits and a method of trimming thereof to improve performance of the circuits to achieve greater yields. The network comprises at least one monolithic resistor connected across a known voltage potential and including a plurality of contacts thereon defining incremental resistances therebetween. The contacts are coupled to a common terminal via a plurality of metallic links. A desired output voltage is derived at the common terminal by open circuiting all of the links but a desired one. The voltage appearing at the common terminal can then be used for trimming a parameter of the monolithic circuit to improve the performance thereof.

16 Claims, 6 Drawing Figures

TRIM NETWORK FOR MONOLITHIC CIRCUITS AND USE IN TRIMMING A D/A CONVERTER

BACKGROUND OF THE INVENTION

This invention relates to trimming circuits and a method of trimming high accuracy monolithic circuits to improve their yield rate. More particularly, a trimming network and method of trimming thereof to improve the linearity of a digital-to-analog converter (DAC) is described.

With present day integrated circuit technologies, untrimmed wafer yields of high accuracy circuits, for example, DAC's, are too low for profitable production of a low cost part. Because of process tolerances, such circuits must be adjusted in some manner to obtain critical parameters.

The most common approach used today employs active trimming wherein the circuit is functionally connected such that an output is continually monitored while trimming is performed. Trimming is stopped when a predetermined output is reached. This method for adjusting the linearity of a monolithic DAC circuit utilizes laser trimming of the ladder matrix formed of thin film resistors. In addition to being relatively expensive, several problems are associated with active trimming. One such problem is mechanical stress and resulting resistor instability which can be caused by the localized heating of the resistor after it has been trimmed. Furthermore, the light of the laser beam and the heat it generates can also adversely affect sensitive circuitry near the trim and cause the circuit to operate abnormally. Additionally, active trimming is very time consuming, thus expensive, because after each pulse of the laser, transients must be allowed to die out before the output can be measured. Still further, since the trim is performed functionally, noise from the laser equipment, as well as drift of the resistive value and other parameters caused by the heating effect of the laser, can affect the accuracy of the trim.

Another technique in the prior art also employs active trimming. In this technique a thin film resistor is utilized having a plurality of contacts defining incremental resistances therebetween. The contacts are shorted together by links made of gold so that incrementally open-circuiting these links varies the resistance of the resistors. The required trimming of this resistor and iterative measuring of the output thereafter is very time consuming. Moreover, light and heat generated during the functional trimming can still present a problem. Also, the use of gold is very expensive and is not typically compatible with monolithic integrated circuit techniques which generally utilize aluminum.

Thus, a need exists for reducing the cost and other problems associated with trimming high accuracy monolithic circuits such as digital to analog converters.

SUMMARY OF THE INVENTION

An object of the present invention is to provide a trim network and method of trimming for improving performance of monolithic circuits and to increase their yield.

Another object of the invention is to provide a trim network and method for monolithic circuits which are suitable for passively trimming the circuits to improve yields thereof during processing.

Still another object of the present invention is to provide a trim network for a digital-to-analog converter circuit and method of trimming of the network to improve the linearity of the converter.

A further object is to provide apparatus and method for automatically testing, in a passive manner, integrated circuits and then trimming to achieve greater yields.

In accordance with the foregoing and other objects of the invention, there is provided a trim network suitable to be utilized with monolithic circuits to improve the performance thereof. The trim network includes at least one monolithic resistor connected across a known voltage potential which includes a plurality of contacts disposed thereon that define incremental resistances therebetween. The contacts are coupled, respectively, to a common terminal by a plurality of metallic links. By open-circuiting all but a predetermined link, the voltage appearing at the common terminal is caused to vary. This variable voltage can be used to trim a circuit parameter of the monolithic circuit to improve the performance thereof.

According to a feature of the invention, the trim network is included in a digital-to-analog converter for trimming the linearity of the converter circuit. The trim network includes five monolithic resistors with the common terminals of each resistor coupled respectively to the emitter of the termination amplifiers of the five most significant bits of the converter. The current through the rungs of the five significant bits of the R-2R ladder network comprising the converter are measured and compared to ideal current values. By adjusting the voltage at the common terminal of each of the resistors of the trim network, the voltage applied to the "2R" resistors of each rung can be adjusted such that the current in each rung of the ladder is trimmed which improves the linearity of the converter.

The significant advantage of the converter/trim network combination is that passive trimming is utilized for improving the linearity of the circuit whereas, heretofore, active trimming has been required. In addition, the trim network can be removed from sensitive circuit portions of the converter such that the light of the laser beam and the heat it generates during trimming will not affect the sensitive circuitry.

DETAILED DESCRIPTION OF THE INVENTION

Digital to Analog Circuit Operation

Figure 1:
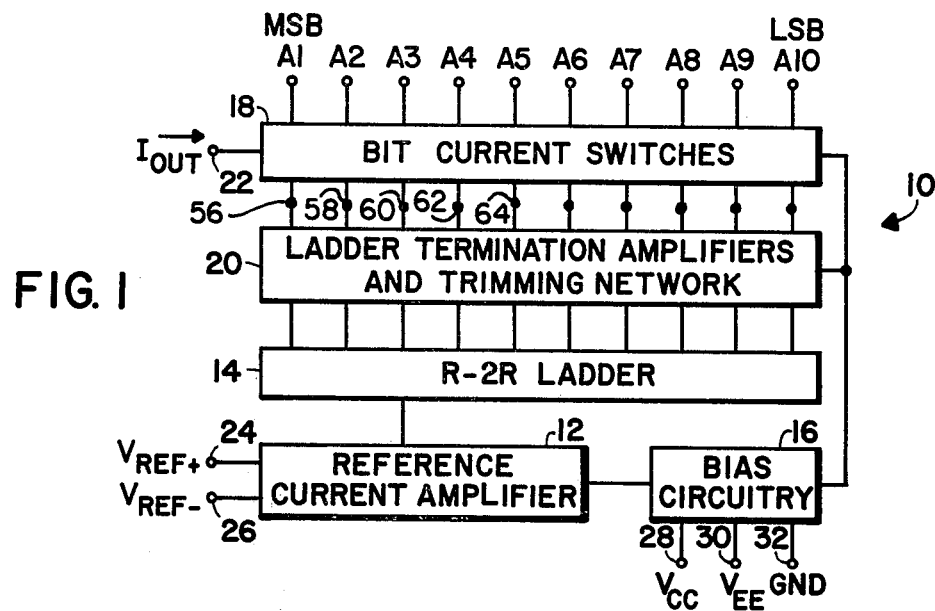
FIG. 1 illustrates in block diagram form a digital to analog converter comprising the trim network of the present invention.

Referring to FIG. 1, there is illustrated in block diagram form 10-bit multiplying digital-to-analog converter (DAC) 10 which is suitable to be manufactured in monolithic integrated circuit form and which includes a trim network in accordance with the preferred embodiment of this invention. The basic circuitry and operation of DAC 10 is well known in the art and, therefore, need not be discussed in great detail. It is understood that although DAC 10 is shown as a 10-bit DAC any number of input bits may be utilized corresponding to the desires of the user. Hence, as illustrated, DAC 10 includes input terminals $A_1$–$A_{10}$ adapted to receive a digital input signal thereat. Input terminal $A_1$ receives the most significant bit (MSB) and terminal $A_{10}$ the least significant bit (LSB) of the input digital signal. DAC 10 comprises reference current amplifier 12, R-2R ladder network 14 coupled to the reference amplifier, bias circuitry 16, bit current switches 18 and termination amplifiers (which are shown as part of trim network 20). An analog output voltage is derived across a user supplied load which is coupled to output terminal 22. In response to a digital input signal applied at terminals $A_1$–$A_{10}$, a representative analog current ($I_{out}$) is conducted through the load. The analog output current is not only a function of the digital input signal but also the reference current produced by reference current amplifier 12 which is adapted to receive user supplied reference voltages $V_{REF}(+)$ and $V_{REF}(-)$ at terminals 24 and 26 respectively. Bias circuitry 16 provides internal bias potentials and is adapted to receive power supply potentials $V_{CC}$, and $V_{EE}$, and a ground reference at terminals 28, 30 and 32 respectively.

Figure 2:
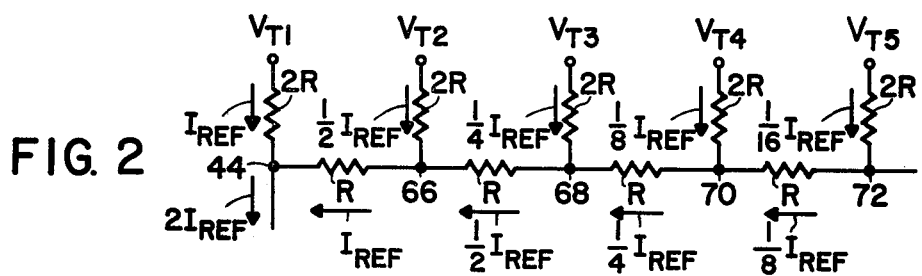
FIG. 2 is a schematic diagram of the five most significant bits of the R-2R ladder of the converter circuit of FIG. 1.
Figure 3:
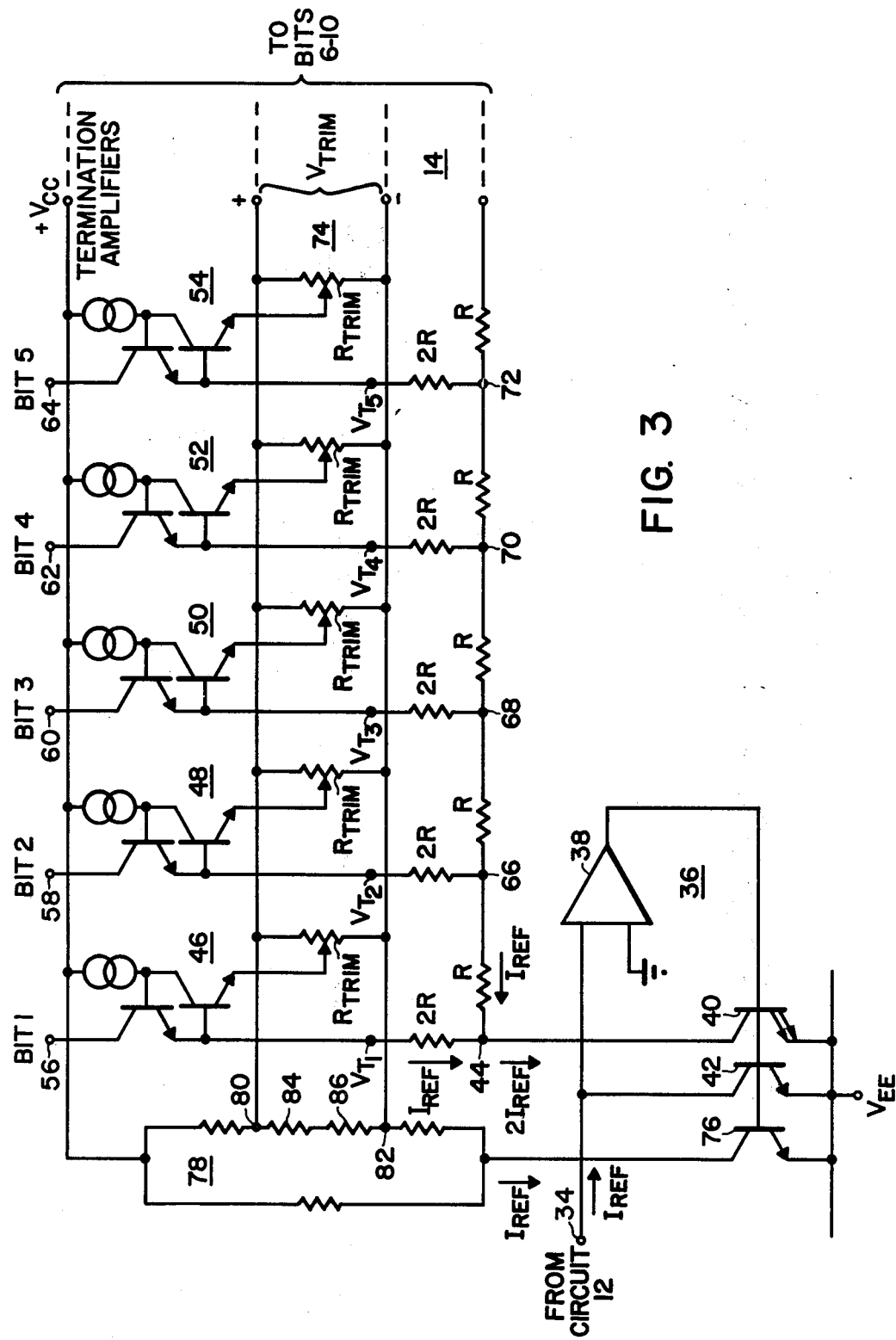
FIG. 3 is a partial block and schematic diagram illustrating the trim network and connection thereof to the converter circuit of FIG. 1.

The operation of DAC 10 is briefly described below. Referring to FIGS. 1-3, reference current amplifier 12 provides a reference current $I_{REF}$ from the user supplied reference voltages $V_{REF}+$ and $V_{REF}-$. This reference current is supplied at terminal 34 (FIG. 3) and is accurately mirrored by circuit 36 comprising: amplifier 38, transistor 40 and transistor 42. A full scale current, $2I_{REF}$, is produced which is fed to R-2R ladder 14 at terminal 44. R-2R ladder 14 divides the full scale current into binary related current components through respective termination amplifiers 46, 48, 50, 52 and 54 (only the five most significant bits of DAC 10 are shown) via respective terminals $V_{T1}$–$V_{T5}$. The unity gain termination amplifiers provide low impedance terminations for each rung of ladder 14 and interface the ladder to the bit current switches of network 18, at terminals 56–64. Bits 6–10 (not shown) are similarly coupled to the R-2R ladder. The bit current switches are coupled to input terminals $A_1$–$A_{10}$ and steer the individual bit currents of the R-2R ladder from either the power supply ($V_{CC}$ terminal) or analog output terminal 22 such that $I_{out}$ is representative of the digital input signal. As stated, the foregoing operation is generally known and is described, for instance, in the "Semiconductor Data Library", vol. 6, published by Motorola Semiconductor Products, Inc. In particular, the data sheets for the MC-1508L, pages 8-209-8-222, are referred to which illustrates a 8 bit DAC similar to DAC 10 of the present invention. The bit current switches may be identical to those shown for the MC-1508L and are noninverting in operation so that a high state on a respective digital input terminal turns on the specific component of the analog output current.

What has been described above is a DAC generally known in the art. One of the most critical parameters which must be tested for is converter linearity. Linearity is related to how closely the actual value of the analog output current tracks the theoretical value as, for example, the digital input number ranges from zero to full scale. Ideally, R-2R ladder 14 incrementally divides the full scale reference current in half at each subsequent bit section. For example, in response to a digital one input at the MSB ($A_1$) the current $I_{REF}$ is steered from output terminal 22 to terminal 56 and through termination amplifier 46. Terminal 22 is coupled to each of the individual termination amplifiers at terminals 56–64 respectively, for example, via a plurality of diodes in a similar manner as the MC-1508L previously discussed. Similarly, a current $I_{REF}$ also flows into node 44 from the remaining ladder sections corresponding to bits 2 through N, where N is the total number of bits of the DAC. However, the value of current flow between terminals $V_{T2}$ and 66 is equal to $\frac{1}{2} I_{REF}$, the value between $V_{T3}$ and 68 equaling $\frac{1}{4} I_{REF}$ and etc. However, in reality, non-linearity results because the current division in the ladder is nonideal because of mismatches of the ladder resistors, which may be either diffused or thin film resistors.

Heretofore, to improve linearity and to meet accuracy requirements for the DAC, the ladder resistors were trimmed in some manner to meet a predetermined accuracy specification. This trimming may be achieved by active laser trimming each resistor of the resistive matrix. As previously discussed, active trimming may be defined as feedback trimming in which an output is continually monitored while trimming is performed. Trimming is stopped as soon as the output reaches a certain level. Active trimming is generally very time consuming because, after each pulse of the laser, transients induced by trimming must be allowed to die out before the output is measured.

Trimming Network and Technique

Referring to FIG. 3, there is shown trim network 74 of the present invention that is suitable for trimming the individual current components through R-2R ladder 14 without requiring trimming of each individual ladder resistor. Generally, rather than perform a trim adjust of the ladder resistors, mismatches of the ladder network can be effectively cancelled by adjusting the termination voltages appearing at node $V_{T1}$, $V_{T2}$... $V_{TN}$. As an example, if the 2R resistor of the most significant bit is low with respect to the other resistors of the ladder (because of processing tolerances) its current will be respectively higher than one half full scale current, $2I_{REF}$. By lowering the termination voltage at terminal $V_{T1}$ an appropriate amount, the current can be lowered to the proper value.

It can be shown that the MSB current, assuming a one percent resistor matching, is nominally one-half the value of the full scale current. Hence any error in the MSB current contributes one fourth percent to the non-linearity of the full scale current. Since each successive less significant bit ideally handles half as much current as the previous one, the typical error with respect to full scale current, is half of the previous bit. Eventually, using the foregoing rationale, a point is reached wherein the error contributed by the less significant bits are within typical linearity requirements for the DAC. It has been determined that only the five most significant bits need be trimmed to achieve good linearity performance of DAC 10. Hence, only the five most significant bits are shown in FIGS. 2 and 3. Therefore by adjusting or trimming the termination voltages ($V_{T1}$-$V_{T5}$) to modify the currents through the individual rungs of the ladder, linearity characteristics of DAC 10 can be improved.

It is to be understood that the trim network 74, to be described, can be used in other applications other than for digital-to-analog converters that require laser trimming of resistors to vary the currents therethrough. However, the present application of the trim network is illustrated for digital-to-analog converters. As shown, a second current equal to $I_{REF}$ is generated by circuit 36 of reference amplifier 12 through transistor 76 and resistive network 78. The current through resistive network 78 produces a known voltage drop, $V_{trim}$, between terminals 80 and 82 by the current flowing through resistors 84 and 86. $V_{trim}$ also appears across each trim resistor of trim network 70. The voltages $V_{T1}$-$V_{T5}$ which termination amplifiers 46-54 provide to the rungs of ladder 14 can be modified by adjusting the center tap of the respective trim resistors, $R_{trim}$. Thus, the individual current through each respective ladder rung may be modified accordingly.

Figure 4:
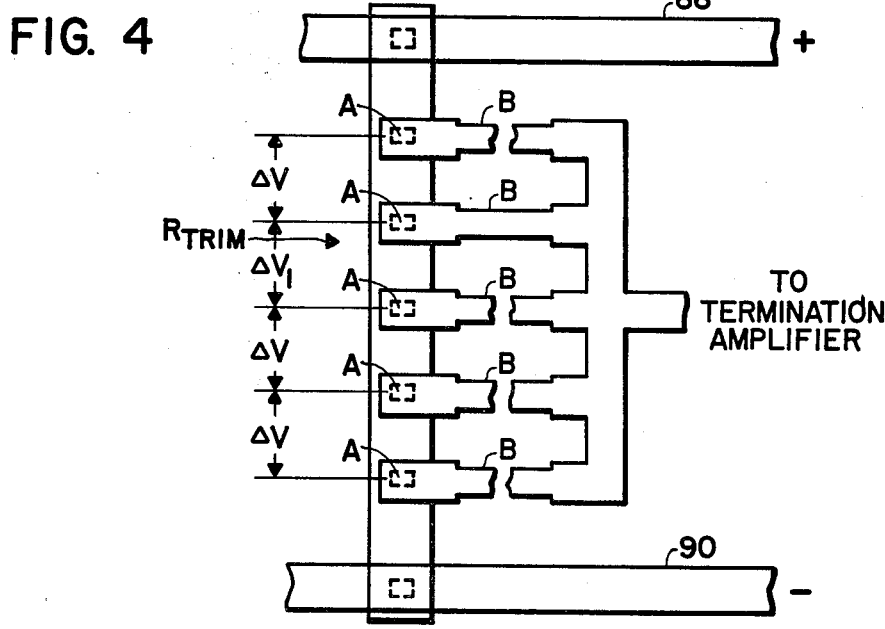
FIG. 4 illustrates the layout of a typical trim resistor comprising the trim network of the invention.

A typical trim resistor is illustrated in FIG. 4. Although $R_{trim}$ may be either a thin film or monolithic resistor, in a preferred form it is a diffused resistor of known construction. The ends of each of the trim resistors are connected to terminals 80 and 82 by positive and negative buses 88 and 90 respectively. Various contacts, shown by the references A, are provided along the body of the resistor which are connected to aluminum links B respectively. The links are connected together at a common connection which is connected to a respective termination amplifier. This common connection is shown as the wiper arm of the trim resistors in FIG. 3. The incremental resistance between the pairs of contacts on the resistor provide known incremental voltage drops, $\Delta V$. By cutting all but one link, as illustrated, the ladder termination voltage can be adjusted to the desired level in increments of $\Delta V$.

As will be discussed in greater detail below, the foregoing passive trimming technique avoids the problems of prior techniques which require active trimming. Based upon measurements made on an untrimmed digital-to-analog converter circuit, the error in current through each rung of the ladder is first determined. Suitable mathematic equations can be solved by a general purpose computer, such as the Teraedyne M365 computer-controller, to determine which links of each resistor need be cut and then direct a laser to cut these links. Trimming is therefore done passively without requiring monitoring such as the iterative scheme of trim and test utilized by prior art techniques.

Prior to trimming, each of the trim resistors of DAC 10 are completely shorted forcing all of the emitters of termination amplifiers 46-54 (which are connected to respective wiper arms of the trim resistors) to be at the same potential. It is to be understood that at this time, DAC 10 is only one dice of a plurality of die on a monolithic wafer which is placed in a probe station for testing. The error in the current in each rung is determined using standard testing techniques. If the linearity of the converter is within a predetermined range a trim is not needed. However, if the error is greater than tolerable, each trim resistor is trimmed to bring the converter into the desired range.

Referring to FIG. 3, note that a current equal to $I_{REF}$ is used to produce a voltage drop across the trim resistors. This drop is divided into incremental steps of $I_{REF}$ volts each. Moreover, the voltage drop across the most significant bit 2R resistor of ladder 14 is $2R \times I_{REF}$. Therefore, the ratio of the incremental trim voltage to the drop across the MSB 2R resistor is $\frac{1}{2}R$ and does not change with variations in sheet resistance, temperature or reference current.

Using matrix mathematic theory, it can be shown that a matrix equation can be determined to describe the relationship between a change in any one termination voltage, $V_T$, and its effect on the voltages across all of the 2R resistors in ladder 14 and the currents therethrough. This matrix equation may be expressed as:

$$[F][\Delta V] = 2R[\Delta I] \qquad (1)$$

where $[\Delta V]$ is a vector representing the changes in voltages at the emitters of the termination amplifiers connected to a wiper arm of a respective trim resistors; $[\Delta I]$ is a vector representing change in currents through the 2R resistors of the five most significant bits of ladder 14; and $[F]$ is a matrix describing the relationship between $[\Delta V]$ and $[\Delta I]$.

The derivation of matrix $[F]$ is straight forward and is equal to:

$$[F] = \begin{matrix} 0.5 & -0.25 & -0.125 & -0.0625 & -0.03125 \\ -0.25 & 0.625 & -0.1875 & -0.09375 & -0.04688 \\ -0.125 & -0.1875 & 0.6562 & -0.1719 & -0.08594 \\ -0.0625 & -0.09375 & -0.1719 & 0.6641 & -0.1680 \\ -0.03125 & -0.04688 & -0.08594 & -0.1680 & 0.6660 \end{matrix}$$

As stated above the $[\Delta I]$ matrix represents the changes in bit currents needed to eliminate the contributions of the first five bits because of non-linearity. This matrix is known once the individual bit currents of DAC 10 are measured and compared with ideal values. The measurement of the individual bit currents is done at wafer probing. For example, referring to FIG. 5 there is illustrated the test circuit for measuring untrimmed currents. A standard digital-to-analog converter 91 is used for comparing the untrimmed currents thereto. The binary input bits of both converter 91 and DAC 10 (under test) are coupled to 10-bit counter 92. The analog outputs of both converters are coupled to an input of amplifier 93. The output of amplifier 93 provides the error information between desired currents (from converter 91) and the untrimmed currents through DAC 10. Thus error information is provided by, for example, supplying a digital signal from counter 92 which produces full scale current output from converter 91. The unit under test is then calibrated at full scale with the reference converter by adjusting resistor 94 until the error voltage at output 96 goes to zero. Then by applying digital inputs in sequential order the individual bit-currents can be compared in a similar manner.

This error information can be supplied to a general purpose computer, such as discussed previously, which then compares the measured currents to the ideal values. Thus, the only unknown quantity of the matrix equation is $[\Delta V]$ which can be solved by the test computer and which is equal to:

$$[\Delta V] = 2R[F]^{-1}[\Delta I] \qquad (2)$$

After the test computer calculates the trim voltages required (equation 2) it can search through a look-up table to determine the appropriate links of each trim resistor to cut. The look-up table is calculated by knowing the incremental voltage steps between each link, as discussed previously. Hence, having determined which links of each trim resistor are to be cut, the computer can provide an activation signal to cause a laser to step through the trim array for cutting the predetermined links of each of the trim resistors.

Figure 5:
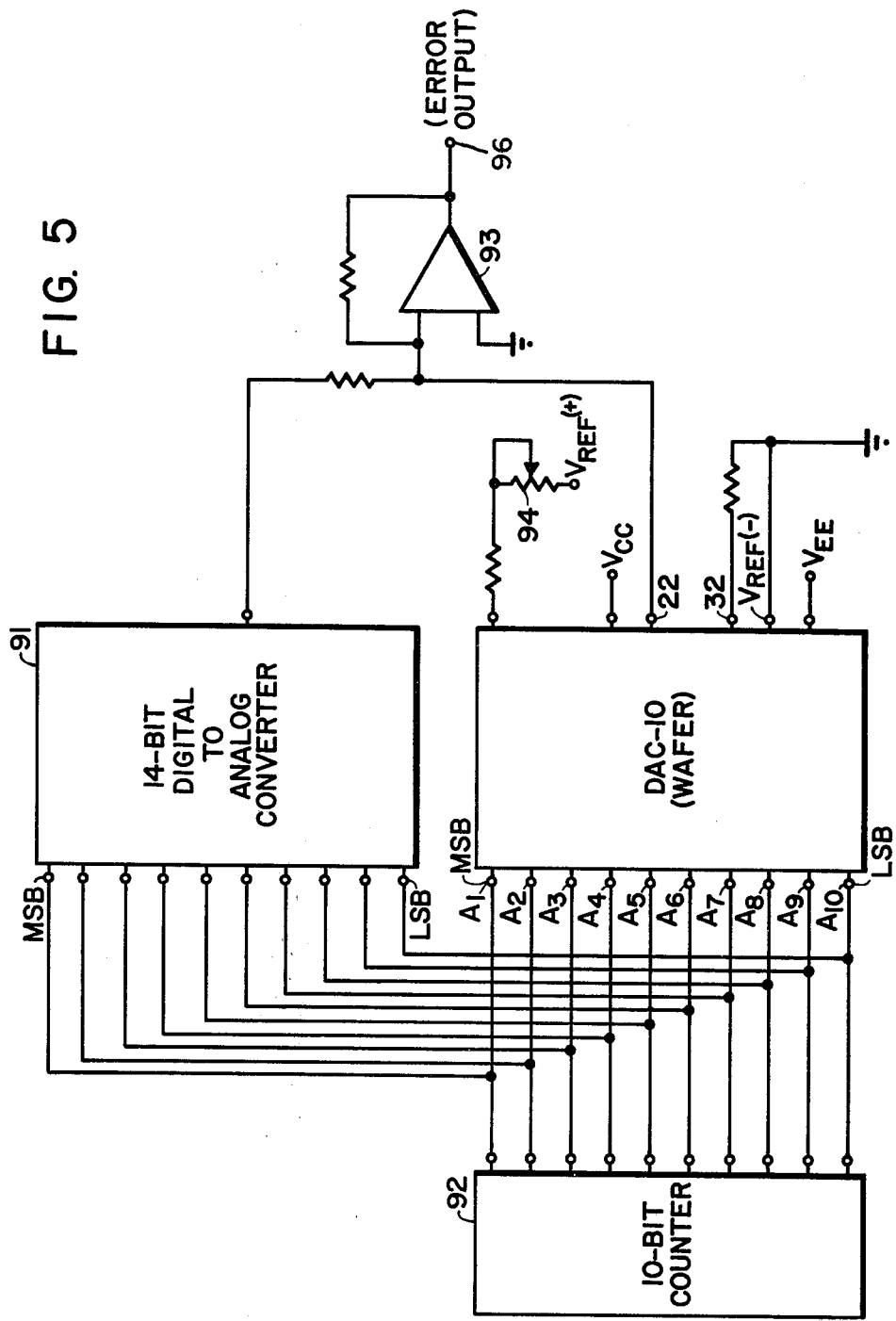
FIG. 5 illustrates in block diagram form the test method for measuring non-linearity of the converter of FIG. 1.
Figure 6:
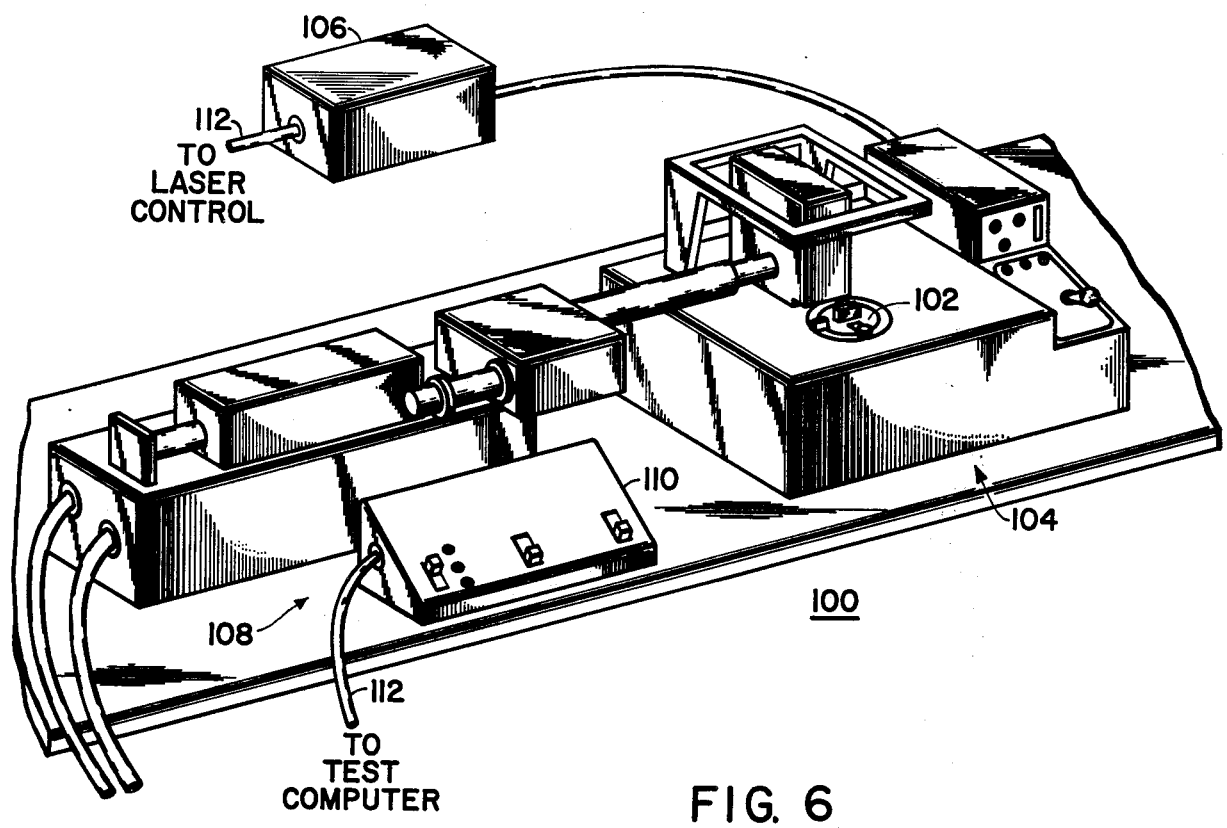
FIG. 6 is a perspective view of a wafer probe test station for testing and trimming of the trim network of the invention.

FIG. 5 illustrates the test station for providing the above described operation. As an example, DAC 10 at wafer level is placed on probe station 100 in probe area 102. Prober 104, which can electronically test several characteristics in a sequential fashion, as is standard in the art, tests the untrimmed currents through each DAC 10 die in comparison with the reference converter and provides this information to computer 106. The test computer, having determined which links of the trim resistor to be cut, steps laser 108 through the trim array and cuts the links. The laser beam of laser 108 is aligned over the trim network by utilization of laser control assembly 110.

Computer 106 is interfaced with laser control assembly 110 for directing cutting of the links, as previously described, by laser 108. Digital-to-analog converters have been fabricated including the trim network described above. It is found that passive trim, including the necessary calculations, is performed in approximately 3 seconds for each circuit. Achieved results after a trim have been $\pm 0.25$ percent non-linearity with a typical drift of $\pm 2.5$ ppm/°C. These values agree very well with computer simulations used in design, and show that passive laser trimming of metal links is a practical and inexpensive way to improve the yield of high accuracy circuits.

In the actual design of the trim network, the trim resistors can be physically removed from the sensitive ladder resistors, thus trimming is performed in an area removed therefrom and the light of the laser beam and the heat it generates can be minimized to sensitive circuitry.

The circuit and method for trimming high accuracy integrated circuits, as disclosed above, provides several significant improvements over the prior art. Particularly, since the actual trim is performed non-functionally (the device being trimmed is powered down) no noise from the laser equipment nor drift caused by the heating effect of the laser can effect accuracy of the trim. The non-functional trim is also performed more quickly than a functional trim because there is no feedback between the measurement system and the trimming system, nor is an iterative trim technique required. Moreover, the accuracy of the trim is independent of sheet resistances from lot to lot, temperature variations and reference current variations. The foregoing described technique for trimming high accuracy circuits may also be applied to other circuits such as low offset operational amplifiers and precision voltage references.

What is claimed is:

1. In a digital-to-analog converter circuit including a reference circuit for providing a reference voltage, a plurality of subsequent least significant input bit terminals adapted to receive a digital input signal, an untrimmed resistive ladder for dividing the reference current into binary related currents having ideal values associated therewith and a plurality of termination amplifiers corresponding to each input bit terminal for providing a low impedance termination to respective rungs of the resistive ladder, the improvement comprising a trim network coupled to the termination amplifiers for adjusting the currents through each rung of the untrimmed resistive ladder such that the value of the binary related currents are substantially equal to the ideal values thereby improving the linearity of the converter circuit, said trim network including at least one impedance means being coupled between a predetermined potential when the digital to analog converter is in an operative state and a plurality of alterable conductor means coupled with said at least one impedance means and a respective one of the termination amplifiers whereby predetermined incremental resistance values are defined between each pair of said plurality of alterable conductor means to define a predetermined difference voltage therebetween such that a predetermined voltage is supplied to said respective termination amplifier when all but a selected one of said conductive means are open circuited by thermal machining.

2. The circuit of claim 1 wherein said one impedance means includes:
   resistive means connected across first and second predetermined potentials and having a plurality of contacts disposed thereon;
   said alterable conductor means being a plurality of metallic links each having one end thereof connected to a common terminal and the other end connected to respective ones of said contacts disposed on said resistive means;
   circuit means coupling said common terminal of said metallic links to said respective termination amplifier such that the voltage appearing at said common terminal is caused to be varied to adjust the value of the current through an associated rung of the ladder.

3. The circuit of claim 2 wherein said impedance means includes a plurality of said resistive means, each one of said resistive means being coupled to a respective termination amplifier for adjusting the current through respective rungs of the ladder to have a value substantially equal to the ideal values.

4. A monolithic digital-to-analog converter comprising in combination:
   an output terminal adapted to be coupled to a load;
   input circuit means adapted to receive an input signal for deriving a reference current;
   impedance means responsive to said reference current for dividing the same into desired individual weighted currents, said impedance means requiring trimming thereof to cause the actual weighted currents to have values substantially equal to said desired values;
   termination means for providing low impedance terminations to said impedance means and to provide a predetermined potential thereto;
   current switching means adapted to receive a digital input signal for either steering currents to said termination means from said output terminal or from a power supply terminal to derive an analog output signal representative of said digital input signal; and
   trimming means coupled to said termination means including at least one resistive means and a plurality of alterable conductor means incrementally coupled to said resistor means for defining incremental resistance values therebetween, said plurality of conductor means being interconnected at a common terminal such that an adjustable and known potential is provided at said common terminal by selectively open circuiting all but one of said conductor means whereby the actual weighted currents through said impedance means are substantially equal to said desired currents.

5. The digital-to-analog converter of claim 4 wherein:
said impedance means includes a resistive ladder having a plurality of individual bit current rungs;
said termination means includes a plurality of amplifier means each coupled to respective ones of said bit current rungs of said resistive ladder; and
said at least one resistive means includes a plurality of contacts thereon for defining said incremental resistances therebetween and said alterable regions being a plurality of metallic links each having an end thereof connected to respective contacts and the other end thereof connected to said output of said trimming means at said common terminal, all of said links being open-circuit but one to derive said predetermined potential.

6. The converter of claim 5 wherein said trimming means includes a plurality of said resistive means for adjusting the current flow through respective ones of said rungs of said resistive ladder.

7. The converter of claim 5 wherein said trimming means is spatially separated from said impedance means a sufficient distance to allow thermal machining thereof to open-circuit said links.

8. In an integrated circuit having a first impedance network for establishing a plurality of weighted currents having desired values, a trim circuit for providing passive trimming of the integrated circuit comprising second impedance means being spatially separated from the first network to allow thermal machining thereat and electrically coupled to the first impedance network for adjusting the weighted currents to be substantially the desired values, said trim circuit including;
(a) at least one resistive means connected between a first and second potential, said resistive means having a plurality of contacts defining incremental resistances therebetween; and
(b) a plurality of metallic links each having an end thereof connected to respective contacts of said resistive means with the other end of each of said links being coupled to a common terminal such that a predetermined and adjustable voltage is derived at said common terminal when all but a predetermined one of said links are open-circuited when the integrated circuit is in a passive state by said thermal machining said predetermined voltage being applied to said first impedance network such that the weighted currents are adjusted to the desired values.

9. The trim circuit of claim 8 wherein said resistive means includes a monolithic resistor.

10. A trim network for adjusting the magnitude of current through a resistive load, comprising:
at least one resistive element connected across a known voltage potential which includes a plurality of contacts defining incremental resistances therebetween such that a plurality of incremental voltage potentials are developed at each contact respectively.
a plurality of metallic links having one end thereof connected to a common terminal with the other ends of each link being connected to respective ones of said contacts, each one of said metallic links being open-circuited except a predetermined one such that a predetermined potential is developed at said common terminal, said predetermined potential being varied in accordance to which links are open-circuited; and
circuit means electrically coupled between said common terminal and the resistive load for causing the voltage across the load to vary as said potential at said common terminal is caused to vary to thereby cause the current through said load to be adjusted.

11. The network of claim 10 wherein said resistive element includes a monolithic resistor.

12. The network of claim 11 wherein said circuit means includes a termination amplifier for providing a low impedance termination to the resistive load.

13. In a monolithic integrated circuit including at least one circuit portion, a network for providing passive trimming of predetermined circuit parameters of the circuit portion, comprising:
impedance means being coupled between a predetermined fixed potential produced by the monolithic integrated circuit when the monolithic integrated circuit is in an operative state;
a plurality of conductive links each attached at one end thereof to said impedance means such that an incremental impedance is produced between successive ones of said plurality of conductive links, the other end of each one of said plurality of conductive links being commonly connected, all but one of said plurality of conductive links being open-circuited by thermal machining thereof when the monolithic integrated circuit is in a nonoperative state such that a predetermined voltage is produced at said commonly connected ends of said plurality of conductive links when the monolithic integrated circuit is in an operative state; and
circuit means for coupling said commonly connected ends of said plurality of conductive links to the at least one circuit portion of the monolithic integrated circuit such that the circuit parameters thereof are adjusted to the desired predetermined values by said predetermined voltage being applied thereto.

14. The network of claim 13 wherein said impedance means is a monolithic resistor.

15. The network of claim 14 wherein each one of said plurality of conductive links being formed of aluminum material compatible with monolithic integrated circuit process techniques.

16. In a monolithic integrated circuit including a resistive circuit for producing a weighted current of desired value when the monolithic integrated circuit is in an operative state, a network suitable for providing passive timming of the monolithic integrated circuit, comprising:
first power supply conductor means;
second power supply conductor means, said first and second power supply conductor means having a predetermined and fixed voltage appearing thereacross when the monolithic integrated circuit is in an operative state;
resistive means being coupled between said first and second power supply conductors and having a plurality of contacts formed thereon which define incremental resistances therebetween;
a plurality of metallic links each having one end thereof connected to a respective one of said plurality of said contacts formed on said resistive means, the other ends of said plurality of metallic links being connected to a common terminal;

circuit means for coupling said common terminal to the resistive circuit of the monolithic integrated circuit; and all but one of said plurality of metallic links being selectively open circuited when the monolithic integrated circuit is in a nonoperative state such that a predetermined voltage is produced at said common terminal when the monolithic integrated circuit is in an operative state whereby the current produced in the resistive circuit of the monolithic integrated circuit is adjusted to the desired value.

* * * * *